(12) United States Patent
Murakami et al.

(10) Patent No.: US 7,220,533 B2
(45) Date of Patent: May 22, 2007

(54) PHOTOSENSITIVE RESIN COMPOSITION, PHOTOSENSITIVE ELEMENT USING THE SAME, METHOD FOR PRODUCING RESIST PATTERN, AND METHOD FOR PRODUCING PRINTED WIRING BOARD

(75) Inventors: Yasuharu Murakami, Hitachi (JP); Takahiro Hidaka, Hitachi (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 100 days.

(21) Appl. No.: 10/239,427

(22) PCT Filed: Mar. 21, 2001

(86) PCT No.: PCT/JP01/02202

§ 371 (c)(1),
(2), (4) Date: Jan. 2, 2003

(87) PCT Pub. No.: WO01/71428

PCT Pub. Date: Sep. 27, 2001

(65) Prior Publication Data

US 2004/0038149 A1    Feb. 26, 2004

(30) Foreign Application Priority Data

Mar. 21, 2000 (JP) ............... 2000-083204
Aug. 7, 2000 (JP) ............... 2000-238522

(51) Int. Cl.
*G03C 1/73* (2006.01)
*G03F 7/029* (2006.01)
*G03F 7/031* (2006.01)
*G03F 7/033* (2006.01)
*G03F 7/30* (2006.01)
*G03F 7/36* (2006.01)

(52) U.S. Cl. .................. 430/281.1; 430/919; 430/920; 430/921; 430/925; 430/285.1; 430/271.1; 430/325; 430/905; 430/910; 430/313; 430/311

(58) Field of Classification Search ............. 430/270.1, 430/920, 919, 914, 281.1, 905, 916, 925, 430/921, 923, 285.1, 271.1, 313, 315, 311, 430/325, 319
See application file for complete search history.

(56) References Cited

U.S. PATENT DOCUMENTS 4,943,516 A * 7/1990 Kamayachi et al. ..... 430/280.1
5,942,372 A * 8/1999 West et al. ............... 430/281.1
6,180,319 B1 1/2001 McKeever
6,844,137 B2 * 1/2005 Fujimaki et al. ......... 430/281.1

FOREIGN PATENT DOCUMENTS

| JP | 8-76369 | 3/1996 |
|---|---|---|
| JP | 8-220759 | 8/1996 |
| JP | 08-314138 | 11/1996 |
| JP | 9-309907 | 12/1997 |
| JP | 10-110008 | 4/1998 |
| JP | 10-123708 A | 5/1998 |
| JP | 11-100408 | 4/1999 |
| JP | 11-327137 A | 11/1999 |
| JP | 2000-310855 | * 11/2000 |
| JP | 2001-194782 A | 7/2001 |
| JP | 2001-201851 A | 7/2001 |

OTHER PUBLICATIONS

English abstract for JP 2000-310855, provided by JPO.*
English translation of JP 8-220759 (Urano et al), provided by PTO.*
English translation of JP 8-76369 (Hashino et al), provided by PTO.*
Machine-assisted translation of JP 2000-310855 (Hidaka et al), provided by DERWENT.*

* cited by examiner

*Primary Examiner*—Sin Lee
(74) *Attorney, Agent, or Firm*—Griffin & Szipl, P.C.

(57) ABSTRACT

The present invention provides a photosensitive resin composition for laser scanning exposure, which satisfies the following formula (1):

$$-25 \leq \frac{E_1 - E_0}{E_0} \times 100 \leq 25 \quad (1)$$

wherein $E_0$ represents an exposure amount in mJ/cm² at which the photosensitive resin composition is cured at the 21st step of the density 1.00 of a 41-step step tablet having a density range from 0.00 to 2.00, a density step of 0.05, a tablet size of 20 mm×187 mm and a step size of 3 mm×12 mm, by irradiation with a full wavelength active light of a high pressure mercury lamp and $E_1$ represents an exposure amount in mJ/cm² at which the photosensitive resin composition after being left for 2 hours under 40 W non-ultraviolet white lamp is cured at the 21st step of the 41-step step tablet by irradiation with a full wavelength active light from a high pressure mercury lamp.

17 Claims, No Drawings

PHOTOSENSITIVE RESIN COMPOSITION, PHOTOSENSITIVE ELEMENT USING THE SAME, METHOD FOR PRODUCING RESIST PATTERN, AND METHOD FOR PRODUCING PRINTED WIRING BOARD

This is a National Phase Application in the United States of International Patent Application No. PCT/JP01/02202 filed Mar. 21, 2001, which claims priority on Japanese Patent Application No. 2000-83204, filed Mar. 21, 2000 and on Japanese Patent Application No. 2000-238522, filed on Aug. 7, 2000.

TECHNICAL FIELD

The present invention relates to a photosensitive resin composition, a photosensitive element using the same, a method for producing a resist pattern and a method for producing a printed wiring board.

BACKGROUND ART

Conventionally, in the field of production for a printed wiring board, as a resist material used for etching, plating, and the like, photosensitive elements obtained by using a photosensitive resin composition, a supporting member and a protection film have been used widely.

The printed wiring board is produced by a method of pattern exposure of a photosensitive element laminated on a copper substrate, eliminating a uncured part with a developing solution, applying an etching or plating for forming a pattern, and eliminating the uncured part from the substrate.

According to the recent trend in favor of a higher density of the printed wiring boards, a high resolution and a high adhesive property are more and more required for the photosensitive element as compared with the conventional photosensitive element.

Moreover, from the viewpoint of the throughput, a high sensitivity is also highly required for the resist.

In contrast, according to a quick generation change of the electronic appliances such as cellular phones, an increase in cost for a mask per one substrate is concerned if the method for forming a resist pattern using the conventional phototool (photomask) is employed. A method for directly imaging a circuit produced by a CAD with a laser beam without the need of a mask (Laser Direct Imaging) is now appreciated.

As mentioned above, it is a characteristic of the LDI to provide many advantages such as efficient production ability by a small number and various kinds, elimination of a positioning step owing to absence of a photomask so as to facilitate correction of scaling, and elimination of any caution for sticking of photomask to photoresist.

According to the conventional laser using a visible light, handling operations had to be done in a dark room or under a red light. The present inventors have found out, by utilizing a laser using an ultraviolet ray, a laser exposing method allowing operations under an yellow light like the ordinary exposure can be realized. However, since a photosensitive resin composition for the ultraviolet ray laser is highly sensitive, there arise a problem such that the photosensitive property is fluctuated due to the light and the heat of the safety light including the yellow light, etc. accompanying the operations, so that the processability is limited.

Further, while the throughput depends on the laser scanning speed, it is still insufficient in terms of the above-mentioned throughput, therefore, propagation thereof is slower than expected. It is found out that the present problem does not reside in equipments but resides in an insufficiency of the sensitivity of the photosensitive resin composition so that an improvement of the scanning speed is prevented.

Additionally, in order to cope with the UV (ultraviolet ray) laser scanning exposure, an extremely highly sensitive resist with an excellent resolution is required so that it cannot be dealt with by the present resist.

The present invention is to solve the above-mentioned problems, and it is to provide a photosensitive resin composition for the laser scanning exposure with a little exposure amount fluctuation under a specific condition after a long term storage, thereby providing an excellent long term storage property and processability, and having an excellent resolution and laser imaging compatibility, in particular, an excellent ultraviolet ray laser imaging compatibility and color change stability after a long term storage.

Further, the present invention is to provide a photosensitive resin composition, a photosensitive element, a method for producing a resist pattern and a method for producing a printed wiring board having an excellent sensitivity, resolution, developing property and mechanical strength, effective for achieving a high density in a printed wiring board and laser exposure, particularly, the ultraviolet ray laser imaging compatibility.

Furthermore, the present invention is to provide a method for producing a resist pattern having an excellent sensitivity, resolution, productivity and processability, effective for achieving a high density in a printed wiring board, and workable under a yellow light in a conventional clean room.

DISCLOSURE OF THE INVENTION

The present invention relates to a photosensitive resin composition for laser scanning exposure which satisfies the following formula (1):

$$-25 \leq \frac{E_1 - E_0}{E_0} \times 100 \leq 25 \quad (1)$$

wherein $E_0$ represents an exposure amount in mJ/cm² at which the photosensitive resin composition is cured at the 21st step of the density 1.00 of a 41-step step tablet having a density range from 0.00 to 2.00, a density step of 0.05, a tablet size of 20 mm×187 mm and a step size of 3 mm×12 mm, by irradiation with a full wavelength active light of a high pressure mercury lamp and $E_1$ represents an exposure amount in mJ/cm² at which the photosensitive resin composition after being left for 2 hours under 40 W non-ultraviolet white lamp is cured at the 21st step of the 41-step step tablet by irradiation with a full wavelength active light from a high pressure mercury lamp.

Moreover, the present invention relates to the photosensitive resin composition comprising (A) a binder polymer, (B) a photopolymerizable compound having at least one polymerizable ethylenically unsaturated group in a molecule and (C) a photopolymerization initiator, wherein said (C) component comprises as essential components (C1) a hexaaryl bisimidazol compound, (C2) an aryl glycine based compound and (C3) an onium salt compound.

Furthermore, the present invention relates to the photosensitive resin composition, wherein an aryl group of the (C1) hexaaryl bisimidazol compound has an alkoxy group having 1 to 6 carbon atoms.

Moreover, the present invention relates to the photosensitive resin composition, wherein the number of the alkoxy group having 1 to 6 carbon atoms in a molecule of the (C1) hexaaryl bisimidazol compound is four.

Furthermore, the present invention relates to the photosensitive resin composition, wherein the (C1) component is a compound represented by the general formula (I):

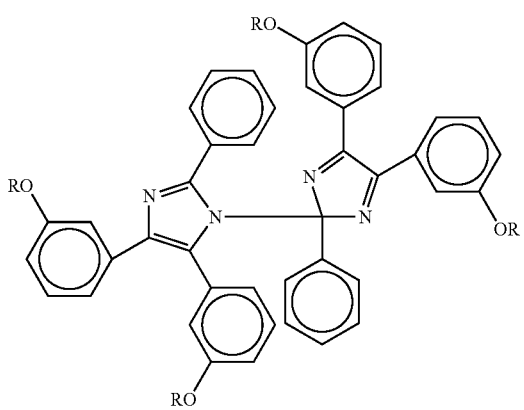

wherein four Rs each independently represent an alkyl group having 1 to 6 carbon atoms.

Moreover, the present invention relates to the photosensitive resin composition, wherein the (C2) component is a compound represented by the general formula (II):

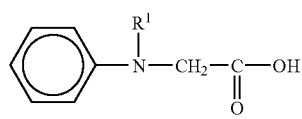

wherein $R_1$ represents a hydrogen atom or an alkyl group having 1 to 6 carbon atoms.

Furthermore, the present invention relates to the photosensitive resin composition, wherein the (C3) onium salt compound is an ammonium salt compound, an iodonium salt compound, or a sulfonium salt compound.

Moreover, the present invention relates to the photosensitive resin composition, wherein the (C3) onium salt compound is an onium boron salt compound.

Furthermore, the present invention relates to the photosensitive resin composition, further comprising (C4) an organic halogen based compound.

Moreover, the present invention relates to the photosensitive resin composition, further comprising a (C5) benzophenone compound having an alkyl amino group or a coumarin compound.

Furthermore, the present invention relates to the photosensitive resin composition, wherein the (B) component comprises a bisphenol A based (meth)acrylate compound as an essential component.

Moreover, the present invention relates to the photosensitive resin composition, wherein the (A) binder polymer comprises a styrene or a styrene derivative as an essential copolymerization component.

Furthermore, the present invention relates to the photosensitive resin composition, wherein the composition ratio of each of the (A) component, the (B) component and the (C) component is 40 to 80 parts by weight for the (A) component, 20 to 60 parts by weight for the (B) component and 0.01 to 20 parts by weight for the (C) component based on 100 parts by weight of the total weight of the (A) component and the (B) component, and the composition ratios of each of the (C1) component, the (C2) component and the (C3) component is 1 to 10 parts by weight for the (C1) component, 0.01 to 3 parts by weight for the (C2) component and 0.01 to 5 parts by weight for the (C3) component based on 100 parts by weight of the total weight of the (A) component and the (B) component.

Moreover, the present invention relates to a photosensitive resin composition containing (A) a binder polymer, (B) a photopolymerizable compound having at least one polymerizable ethylenically unsaturated group in a molecule and (C) a photopolymerization initiator, wherein the (C) component comprises as essential components (C1) a hexaaryl bisimidazol compound, and (C4) an organic halogen based compound.

Furthermore, the present invention relates to the photosensitive resin composition, wherein the (C4) organic halogen based compound has a bromine atom in a molecule as the halogen atom.

Moreover, the present invention relates to a photosensitive element obtained by coating the photosensitive resin composition on a supporting member and drying the same.

Furthermore, the present invention relates to a method for producing a resist pattern, comprising the steps of laminating the photosensitive element on a substrate for forming a circuit so that the photosensitive resin layer is closely contact with the substrate, irradiating an active light according to an image, photocuring an exposed portion and removing an unexposed portion by development.

Moreover, the present invention relates to a method for producing a printed wiring board, comprising etching or plating a substrate for forming a circuit on which a resist pattern is produced by the above-mentioned method for producing a resist pattern.

Furthermore, the present invention relates to a method for producing a resist pattern, comprising steps of laminating a photosensitive resin composition layer on a substrate for forming a circuit so that they are closely contacted, scanning and exposing the same with a UV (ultraviolet ray) laser, photocuring an exposed portion, and removing an unexposed portion by development.

BEST MODE FOR CARRYING OUT THE INVENTION

Hereinafter, the present invention will be explained in detail.

In the present invention, a (meth)acrylic acid means an acrylic acid and a methacrylic acid corresponding thereto, a (meth)acrylate means an acrylate and a methacrylate corresponding thereto, and a (meth)acryloyl group means an acryloyl group and a methacryloyl group corresponding thereto.

A photosensitive resin composition of the present invention has three independent characteristics.

The first characteristic of the photosensitive resin composition for laser scanning exposure of the present invention is that it satisfies the following formula (1):

$$-25 \leq \frac{E_1 - E_0}{E_0} \times 100 \leq 25 \tag{1}$$

wherein $E_0$ represents an exposure amount in mJ/cm² at which the photosensitive resin composition is cured at the 21st step of the density 1.00 of a 41-step step tablet having a density range from 0.00 to 2.00, a density step of 0.05, a tablet size of 20 mm×187 mm and a step size of 3 mm×12 mm, by irradiation with a full wavelength active light of a high pressure mercury lamp and $E_1$ represents an exposure amount in mJ/cm² at which the photosensitive resin composition after being left for 2 hours under 40 W non-ultraviolet white lamp is cured at the 21st step of the 41-step step tablet by irradiation with a full wavelength active light from a high pressure mercury lamp.

As the photosensitive resin composition for laser scanning exposure, that satisfy the above-mentioned condition, for example, a photosensitive resin composition having the second characteristic of the present invention, and a photosensitive resin composition having the third characteristic of the present invention as mentioned below, and the like can be mentioned.

The second characteristic of the photosensitive resin composition according to the present invention is that it comprises (A) a binder polymer, (B) a photopolymerizable compound having at least one polymerizable ethylenically unsaturated group in a molecule and (C) a photopolymerization initiator, wherein the (C) component includes as essential components (C1) a hexaaryl bisimidazol compound, (C2) an aryl glycine based compound, and (C3) an onium salt compound.

Moreover, the third characteristic of the photosensitive resin composition according to the present invention is that, in the photosensitive resin composition containing the (A) binder polymer, the (B) photopolymerizable compound having at least one polymerizable ethylenically unsaturated group in a molecule and the (C) photopolymerization initiator, the (C) component comprises as essential components (C1) a hexaaryl bisimidazol compound and (C4) an organic halogen based compound.

In the above-mentioned formula (1), $\{(E_1-E_0)/E_0\}\times100$ need to be $-25 \leq \{(E_1-E_0)/E_0\}\times100 \leq 25$, preferably $0 \leq \{(E_1-E_0)/E_0\}\times100 \leq 25$, and more preferably $0 \leq \{(E_1-E_0)/E_0\}\times100 \leq 20$.

As a photosensitive resin composition that satisfies $-25 \leq \{(E_1-E_0)/E_0\}\times100 \leq 0$, for example, a photosensitive resin composition containing a sensitizer having an absorption range in a long wavelength (visible light), and the like can be presented.

In the above-mentioned formula (1), in the case $\{(E_1-E_0)/E_0\}\times100$ is less than −25, or more than 25, the photosensitive resin composition tends not to serve for a practical use after a long term storage as a photosensitive resin composition for laser scanning exposure.

As the above-mentioned (A) binder polymer, for example, an acrylic based resin, a styrene based resin, an epoxy based resin, an amide based resin, an amide epoxy based resin, an alkyd based resin, a phenol based resin, and the like can be presented. From the viewpoint of the alkaline developing property, an acrylic based resin is preferable. These can be used alone or in combination of two or more kinds.

The above-mentioned (A) binder polymer can be produced, for example by radical polymerization of a polymerizable monomer.

As the above-mentioned polymerizable monomer, for example, polymerizable styrene derivatives such as styrene, vinyltoluene, α-methylstyrene, p-methylstyrene, p-ethylstyrene, p-methoxystyrene, p-ethoxystyrene, p-chlorostyrene and p-bromostyrene, acrylamides such as diacetone acrylamide, esters of a vinyl alcohol, such as acrylonitrile and vinyl-n-butyl ether, an alkyl ester (meth)acrylate, tetrahydrofurfurylic ester (meth)acrylate, dimethylaminoethyl ester (meth)acrylate, diethylaminoethyl ester (meth)acrylate, glycidyl ester (meth)acrylate, 2,2,2-trifluoroethyl (meth)acrylate, 2,2,3,3-tetrafluoropropyl (meth)acrylate, (meth)acrylic acid, α-bromo(meth)acrylic acid, α-chlor(meth)acrylic acid, β-furyl(meth)acrylic acid, β-styryl(meth)acrylic acid, maleic acid, maleic anhydride, monoester maleates such as monomethyl maleate, monoethyl maleate and a monoisopropyl maleate, fumaric acid, cinnamic acid, a α-cyano cinnamic acid, itaconic acid, crotonic acid, propiolic acid and the like can be presented.

As the above-mentioned alkyl ester (meth)acrylate, for example, a compound represented by a general formula (III),

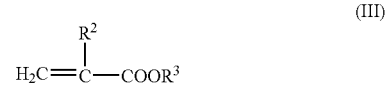

wherein $R^2$ represents a hydrogen atom or a methyl group and $R^3$ represents an alkyl group having 1 to 12 carbon atoms, the above-mentioned compound with the alkyl group substituted by a hydroxyl group, an epoxy group, a halogen group, and the like, can be presented.

As the alkyl group having 1 to 12 carbon atoms represented by $R^3$ in the above-mentioned general formula (III), for example, methyl group, ethyl group, propyl group, butyl group, pentyl group, hexyl group, heptyl group, octyl group, nonyl group, decyl group, undecyl group, dodecyl group and a structural isomer thereof can be presented.

As the monomer represented by the above-mentioned general formula (III), for example, methyl (meth)acrylate, ethyl (meth)acrylate, propyl (meth)acrylate, butyl (meth)acrylate, pentyl (meth)acrylate, hexyl (meth)acrylate, heptyl (meth)acrylate, octyl (meth)acrylate, 2-ethyl hexyl (meth)acrylate and the like can be presented. These can be used alone or in combination of two or more kinds.

From the viewpoint of the alkaline developing property, it is preferable that the above-mentioned (A) binder polymer contains a carboxyl group. For example, it can be produced by radical polymerization of a polymerizable monomer having a carboxyl group and another polymerizable monomer. As the above-mentioned polymerizable monomer having a carboxyl group, a methacrylic acid is preferable. Moreover, from the viewpoint of the flexibility, it is preferable that the above-mentioned (A) binder polymer contains styrene or a styrene derivative as a polymerizable monomer.

In order to improve both the adhesive property and the removing characteristic, it is preferable to contain the above-mentioned styrene or styrene derivative as a polymerizable monomer by 0.1 to 30% by weight, more preferably by 1 to 28% by weight, and particularly preferably by 1.5 to 27% by weight. When the content is less than 0.1% by weight, the adhesive property tends to be deteriorated, and when it exceeds 30% by weight, removed pieces become large and removing time is prolonged.

Moreover, as needs arise, the above-mentioned binder polymer may have a photosensitive group.

These binder polymers can be used alone or in combination of two or more kinds. As a binder polymer in the case of using in combination of two or more kinds, for example, two or more kinds of binder polymers having different copolymer components, two or more kinds of binder polymers having different weight average molecular weights, two or more kinds of binder polymers having different dispersion degrees, and the like can be presented. Moreover, a polymer having a multi mode molecular weight distribution disclosed in Japanese Provisional Patent Publication No. 327137/1999 can be used as well.

The acid value of the above-mentioned (A) component is preferably 30 to 200 mg KOH/g, more preferably 45 to 150 mg KOH/g. If the acid value is less than 30 mg KOH/g, the developing time tends to be prolonged, and if it is more than 200 mg KOH/g, the developing solution resistance of a photocured resist tends to be lowered.

The weight average molecular weight (measured by gel permeation chromatography (GPC) and converted by using a calibration curve using a standard) is preferably 20,000 to 300,000, more preferably 25,000 to 150,000. If the weight average molecular weight is less than 20,000, the developer resistance of exposed area tends to be lowered, and if it is more than 300,000, the developing time goes long.

As the above-mentioned (B) photopolymerizable compound having at least one polymerizable ethylenically unsaturated group in the molecule, for example, a compound obtained by reacting a polyhydric alcohol with an α,β-unsaturated carboxylic acid, bisphenol A based (meth)acrylate compounds such as 2,2-bis(4-((meth)acryloxypolyethoxy)phenyl)propane, 2,2-bix(4-((meth)acryloxypolypropoxy)phenyl)propane, 2,2-bis(4-((meth)acryloxypolybutoxy)phenyl)propane and 2,2-bis(4-((meth)acryloxypolyethoxypolypropoxy)phenyl)propane, a compound obtained by reacting a glycidyl group containing compound with an α,β-unsaturated carboxylic acid, an urethane monomer such as a (meth)acrylate compound having an urethane bond, phthalic acid based compounds such as nonyl phenoxy polyethylene oxy(meth)acrylate, γ-chloro-β-hydroxy propyl-β'-(meth)acryloyloxy ethyl-o-phthalate and a β-hydroxy alkyl-β'-(meth)acryloyloxy-o-phthalate, and an alkyl ester (meth)acrylate, and the like can be presented. It is preferable to contain as essential components a bisphenol A based (meth)acrylate compound or a (meth)acrylate compound having an urethane bond. These can be used alone or in combination of two or more kinds.

As the above-mentioned compound obtained by reacting a polyhydric alcohol with an α,β-unsaturated carboxylic acid, for example, a polyethylene glycol di(meth)acrylate having 2 to 14 ethylene groups, a polypropylene glycol di(meth)acrylate having 2 to 14 propylene groups, a polyethylene polypropylene glycol glycol di(meth)acrylate having 2 to 14 ethylene groups and 2 to 14 propylene groups, trimethylol propane di(meth)acrylate, trimethylol propane tri(meth)acrylate, EO modified trimethylol propane tri(meth)acrylate, PO modified trimethylol propane tri(meth)acrylate, EO,PO modified trimethylol propane tri(meth)acrylate, tetramethylol methane tri(meth)acrylate, tetramethylol methane tetra(meth)acrylate, dipentaerythritol penta(meth)acrylate, dipentaerythritol hexa(meth)acrylate, and the like can be presented.

As the above-mentioned 2,2-bis(4-((meth)acryloxy polyethoxy) phenyl) propane, for example, 2,2-bis(4-((meth)acryloxydiethoxy)phenyl)propane, 2,2-bis(4-((meth)acryloxytriethoxy)phenyl)propane, 2,2-bis(4-((meth)acryloxytetraethoxy)phenyl)propane, 2,2-bis(4-((meth)acryloxypentaethoxy)phenyl)propane, 2,2-bis(4-((meth)acryloxyhexaethoxy)phenyl)propane, 2,2-bis(4-((meth)acryloxyheptaethoxy)phenyl)propane, 2,2-bis(4-((meth)acryloxyoctaethoxy)phenyl)propane, 2,2-bis(4-((meth)acryloxynonaethoxy)phenyl)propane, 2,2-bis(4-((meth)acryloxydecaethoxy)phenyl)propane, 2,2-bis(4-((meth)acryloxyundecaethoxy)phenyl)propane, 2,2-bis(4-((meth)acryloxydodecaethoxy)phenyl)propane, 2,2-bis(4-((meth)acryloxytridecaethoxy)phenyl)propane, 2,2-bis(4-((meth)acryloxytetradecaethoxy)phenyl)propane, 2,2-bis(4-((meth)acryloxypentadecaethoxy)phenyl)propane, 2,2-bis(4-((meth)acryloxyhexadecaethoxy)phenyl)propane, and the like can be presented. The 2,2-bis(4-(methacryloxy pentaethoxy) phenyl) propane is commercially available as BPE-500 (manufactured by Shinnakamura Kagaku Kogyo Co., trade name). The 2,2-bis(4-(methacryloxypentadecaethoxy) phenyl)propane is commercially available as BPE-1300 (manufactured by Shinnakamura Kagaku Kogyo Co., trade name). These can be used alone or in combination of two or more kinds.

As the above-mentioned 2,2-bis(4-((meth)acryloxy polyethoxypolypropoxy)phenyl)propane, for example, a 2,2-bis (4-((meth)acryloxydiethoxyoctapropoxy)phenyl)propane, a 2,2-bis(4-((meth)acryloxytetraethoxytetrapropoxy) phenyl) propane, a 2,2-bis(4-((meth)acryloxy hexaethoxy hexapropoxy)phenylpropane, and the like can be presented. These can be used alone or in combination of two or more kinds.

As the above-mentioned urethane monomer, for example, an addition reaction product of a (meth)acrylic monomer having an OH group at a β position and a diisocyanate compound such as isophorone diisocyanate, 2,6-toluene diisocyanate, 2,4-toluene diisocyanate, 1,6-hexamethylene diisocyanate, tris((meth)acryloxytetraethylene glycol isocyanate)hexamethylene isocyanurate, EO modified urethane di(meth)acrylate, EO, PO modified urethane di(meth)acrylate, and the like can be presented. As the EO modified urethane di(meth)acrylate, for example, a product name UA-11 manufactured by Shinnakamura Kagaku Kogyo Corp. and the like can be presented. Moreover, as the EO, PO modified urethane di(meth)acrylate, for example, a product name UA-13 manufactured by Shinnakamura Kagaku Kogyo Corp. and the like can be presented.

Incidentally, EO represents ethylene oxide, and the EO modified compound has a block structure of an ethylene oxide group. Further, PO denotes a propylene oxide, and the PO modified compound has a block structure of a propylene oxide group.

As the above-mentioned nonylphenoxypolyethylene oxy (meth)acrylate, for example, nonylphenoxytetraethylene oxy(meth)acrylate, nonylphenoxypentaethylene oxy(meth) acrylate, nonylphenoxyhexaethylene oxy(meth)acrylate, nonylphenoxyheptaethylene oxy(meth)acrylate, nonylphenoxyoctaethylene oxy(meth)acrylate, nonylphenoxynonaethylene oxy(meth)acrylate, nonylphenoxydecaethylene oxy(meth)acrylate, nonylphenoxyundecaethylene oxy (meth)acrylate, and the like can be presented.

The above-mentioned (C1) hexaaryl bisimidazol compound is not particularly limited. It is preferable that an aryl group has an alkoxy group having 1 to 6 carbon atoms, and it is preferable that the number of the alkoxy groups having 1 to 6 carbon atoms in a molecule is four. As an example thereof, a compound represented by the above-mentioned general formula (I) and the like can be presented.

As the above-mentioned alkoxy group having 1 to 6 carbon atoms, for example, a methoxy group, an ethoxy group, a propoxy group, an isopropoxy group, a butoxy group, a pentoxy group, a structural isomer thereof and the like can be presented. It is preferably a methoxy group. These can be used alone or in combination of two or more kinds.

In the above-mentioned general formula (I), each of the four Rs independently represent an alkyl group having 1 to 6 carbon atoms, such as those mentioned above as $R^3$ in the general formula (III). It is preferably a methyl group.

Moreover, the phenyl group in the above-mentioned general formula (I) may have a substituent. As an example thereof, a halogen atom, an alkyl group having 1 to 20 carbon atoms, a cycloalkyl group having 3 to 10 carbon atoms, an aryl group having 6 to 18 carbon atoms, a phenacyl group, an amino group, an alkyl amino group having 1 to 10 carbon atoms, a dialkyl amino group having 2 to 20 carbon atoms, a nitro group, a cyano group, a carbonyl group, a mercapto group, an alkyl mercapto group having 1 to 10 carbon atoms, an allyl group, a hydroxyl group, a hydroxy alkyl group having 1 to 20 carbon atoms, a carboxyl group, a carboxy alkyl group with an alkyl group having 1 to 10 carbon atoms, an acyl group with an alkyl group having 1 to 10 carbon atoms, an alkoxy group having 1 to 20 carbon atoms, an alkoxy carbonyl group having 1 to 20 carbon atoms, an alkyl carbonyl group having 2 to 10 carbon atoms, an alkenyl group having 2 to 10 carbon atoms, an N-alkyl carbamoyl group having 2 to 10 carbon atoms, a group including a heterocycle, an aryl group substituted by these substituents and the like can be presented. In the case the number of the above-mentioned substituents is two or more, these two or more substituents may be the same or different.

As the above-mentioned (C1) hexaaryl bisimidazol compound, for example, 2,2'-bis(2-chlorophenyl)-4,4',5,5'-tetraphenyl bisimidazol, 2,2'-bis(2,4-dichlorophenyl)-4,4',5,5'-tetraphenyl bisimidazol, 2,2'-bis(2,3-dichlorophenyl)-4,4',5,5'-tetraphenyl bisimidazol, 2,2'-bis(2-chlorophenyl)-4,4',5,5'-tetrakis(3-methoxyphenyl) bisimidazol, 2,2'-bis(2,3-dichlorophenyl)-4,4',5,5'-tetrakis(3-methoxyphenyl) bisimidazol, 2,2'-bis(2,4-dichlorophenyl)-4,4',5,5'-tetrakis(3-methoxyphenyl) bisimidazol, 2,2'-bis(2,6-dichlorophenyl)-4,4',5,5'-tetrakis(3-methoxyphenyl) bisimidazol, 2,2'-bis(2-fluorophenyl)-4,4',5,5'-tetraphenyl bisimidazol, 2,2'-bis(2,4-difluorophenyl)-4,4',5,5'-tetraphenyl bisimidazol, 2,2'-bis(2,3-difluorophenyl)-4,4',5,5'-tetraphenyl bisimidazol, 2,2'-bis(2-fluorophenyl)-4,4',5,5'-tetrakis(3-methoxyphenyl) bisimidazol, 2,2'-bis(2,3-difluorophenyl)-4,4',5,5'-tetrakis(3-methoxy phenyl) bisimidazol, 2,2'-bis(2,4-difluorophenyl)-4,4',5,5'-tetrakis(3-methoxyphenyl) bisimidazol, 2,2'-bis(2,6-difluorophenyl)-4,4',5,5'-tetrakis(3-methoxyphenyl) bisimidazol, 2,2'-bis(2-bromo phenyl)-4,4',5,5'-tetraphenyl bisimidadzol, 2,2'-bis(2,4-dibromophenyl)-4,4',5,5'-tetraphenyl bisimidazol, a 2,2'-bis(2,3-dibromophenyl)-4,4',5,5'-tetraphenyl bisimidazol and the like can be presented. These can be used alone or in combination of two or more kinds.

As the above-mentioned (C2) aryl glycine based compound, for example, a compound represented by the above-mentioned general formula (II) and the like can be presented.

In the above-mentioned general formula (II), a hydrogen atom, an alkyl group having 1 to 6 carbon atoms, and the like can be presented. Moreover, a phenyl group in the above-mentioned general formula (II) may have a substituent. As an example thereof, the above-mentioned substituents, and the like can be presented. In the case the number of the above-mentioned substituents is two or more, the two or more substituents may be the same or different.

As the above-mentioned (C2) aryl glycine based compound, for example, N-phenylglycine (NPG), N-(p-chlorophenyl)glycine, N-(p-bromophenyl)glycine, N-(p-cyanophenyl)glycine, N-(p-methylphenyl)glycine, N-butyl-N-phenylglycine, N-ethyl-N-phenylglycine, N-propyl-N-phenylglycine, N-methyl-N-phenylglycine, N-(p-bromophenyl)-N-methylglycine, N-(p-chlorophenyl)-N-ethylglycine and the like can be presented. These can be used alone or in combination of two or more kinds.

As the above-mentioned (C3) onium salt compound, for example, an iodonium salt compound, a sulfonium salt compound, an ammonium salt compound, a phosphonium salt compound, an arsonium salt compound, a stibonium salt compound, an oxonium salt compound, a selenonium salt compound, a stannonium salt compound and the like can be presented. It is preferably an ammonium salt compound, an iodonium salt compound or a sulfonium salt compound. These can be used alone or in combination of two or more kinds.

As the above-mentioned iodonium salt compound, a diaryl iodonium salt compound is preferable. As an example thereof, a compound represented by the general formula (IV):

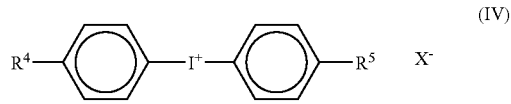

wherein $R^4$ and $R^5$ each independently represent a hydrogen atom, an alkyl group having 1 to 6 carbon atoms or an alkoxy group having 1 to 6 carbon atoms, and $X^-$ represents a pair anion, and the like can be presented.

As the $X^-$ in the above-mentioned general formula (IV), for example, a halogen ion such as a $Cl^-$ and $Br^-$, a pair anion such as $HSO^{4-}$, $BF^{4-}$, $PF^{6-}$, $AsF^{6-}$, $ClO^{4-}$, $FSO^{3-}$, $F_2PO^{2-}$, $SbF^{6-}$, $CF_3SO^{3-}$, $C_4F_9SO^{3-}$, $B(C_6F_5)^{4-}$, $CH_3SO^{3-}$, $C_8F_{17}SO^{3-}$,

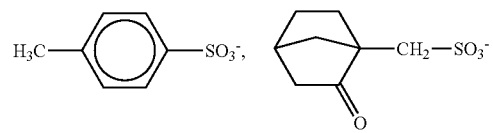

and the like can be presented. These can be used alone or in combination of two or more kinds.

As the above-mentioned iodonium salt compound, for example, a chloride, a bromide, a triflate, a boronate tetrafluoride, a phosphate hexafluoride, an arsenic salt hexafluoride, an antimony salt hexafluoride, a benzene sulfonate, a p-toluene sulfonate and a tetrakis(pentafluorophenyl) boronate of a diphenyl iodonium salt, a ditolyl iodonium salt, a phenyl (p-methoxyphenyl) iodonium salt, a bis(p-tert-butylphenyl) iodonium salt, a bis(p-cyanophenyl) iodonium salt and a 4-isopropyl-4'-methyldiphenyl iodonium salt, and the like can be presented.

As preferable examples of these onium salt compounds, substances of the below-mentioned structural formulae and the like can be presented.

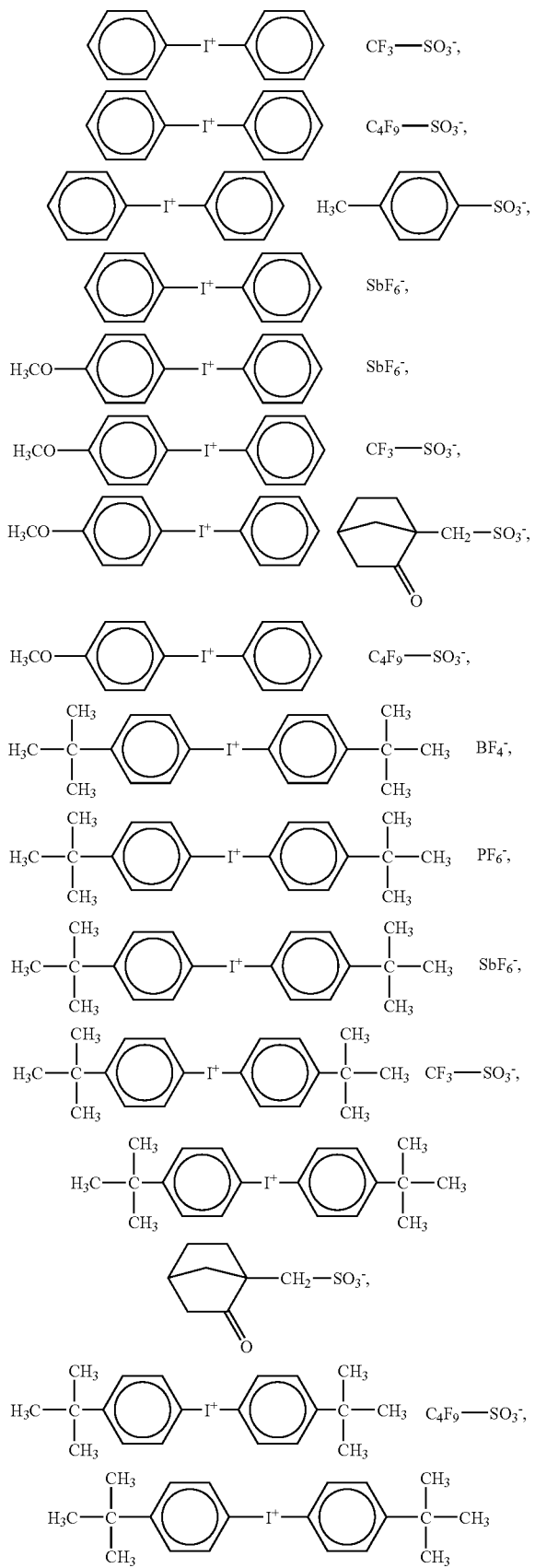

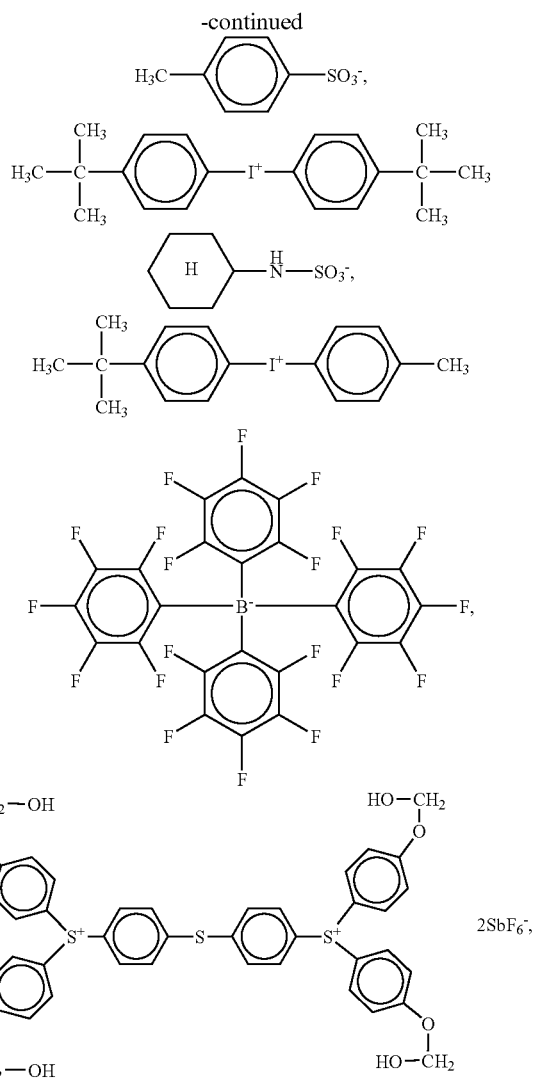

Moreover, the above-mentioned (C3) onium salt compound is preferably an onium boron salt compound. As an example thereof, for example, tetramethyl ammonium butyl triphenyl borate, tetraethyl ammonium butyl triphenyl borate, tetrabutyl ammonium butyl triphenyl borate, tetramethyl ammonium tris(2-fluorophenyl)butylborate, tetramethyl ammonium tris(3-fluorophenyl)butylborate, tetramethyl ammonium tris(4-fluorophenyl)butylborate, tetraethyl ammonium tris(2-fluorophenyl)butylborate, tetraethyl ammonium tris(3-fluorophenyl)butylborate, tetraethyl ammonium tris(4-fluorophenyl)butylborate, tetramethyl ammonium tris(2-fluorophenyl)hexylborate, tetramethyl ammonium tris(3-fluorophenyl)hexylborate, tetramethyl ammonium tris(4-fluorophenyl)hexylborate, tetraethyl ammonium tris(2-fluorophenyl)hexylborate, tetraethyl ammonium tris(3-fluorophenyl)hexylborate, tetraethyl ammonium tris(4-fluorophenyl)hexylborate, tetrabutyl ammonium tris(2-fluorophenyl)hexylborate, tetrabutyl ammonium tris(3-fluorophenyl)hexylborate, tetrabutyl ammonium tris(4-fluorophenyl)hexyl borate and the like can be presented. It is preferable to use them in combination with the above-mentioned iodonium salt compound, the sulfonium salt compound and the like. These can be used alone or in combination of two or more kinds.

The above-mentioned (C4) organic halogen based compound is not particularly limited as long as it is an organic compound having a halogen atom in a molecule. The above-mentioned halogen atom is not particularly limited, however, it is preferably a bromine atom, and it is more preferable that a tribromo methyl group is provided in a molecule. As an example thereof, tribromomethylphenylsulfone (manufactured by Sumitomo Chemicals Co. Ltd., product name: TPS), 2-tribromomethyl sulfonyl pyridine (manufactured by Sumitomo Chemicals Co. Ltd., product name: BSP), tribromoacetophenone, bis(tribromo methyl) sulfone and the like can be presented. These can be used alone or in combination of two or more kinds.

As the above-mentioned benzophenone compound having an alkyl amino group, for example, N,N'-tetramethyl-4,4'-diamino benzophenone (Michler's ketone), N,N'-tetraehyl-4,4'-diamino benzophenone and the like can be presented. These can be used alone or in combination of two or more kinds.

As the above-mentioned coumarin compound, for example, 7-amino-4-methylcoumarin, 7-dimethylamino-4-methylcoumarin, 7-diethylamino-4-methylcoumarin, 7-methylamino-4-methylcoumarin, 7-ethylamino-4-methylcoumarin, 7-dimethyl aminocyclopenta[c]coumarin, 7-aminocyclopenta[c]coumarin, 7-diethylaminocyclopenta[c]coumarin, 4,6-dimethyl-7-ethylaminocoumarin, 4,6-diethyl-7-ethylaminocoumarin, 4,6-dimethyl-7-diethylaminocoumarin, 4,6-dimethyl-7-dimethylaminocoumarin, 4,6-diethyl-7-diethylaminocoumarin, 4,6-diethyl-7-dimethylaminocoumarin, 4,6-dimethyl-7-ethylaminocoumarin, and the like can be presented. These can be used alone or in combination of two or more kinds.

Moreover, the photosensitive resin composition of the present invention may include a photopolymerization initiator other than the (C1) component, the (C2) component, the (C3) component, the (C4) component and the (C5) component in a range that the effect of the present invention is not hindered.

The amount of the above-mentioned (A) component is preferably 40 to 80 parts by weight with respect to 100 parts by weight of the total amount of the (A) component and the (B) component, and more preferably 40 to 70 parts by weight. When the amount is less than 40 parts by weight, the photocured product becomes fragile so that the coating film property tends to be poor in the case of using the same as a photosensitive element. When it exceeds 80 parts by weight, the sensitivity becomes insufficient.

The amount of the above-mentioned (B) component is preferably 20 to 60 parts by weight with respect to 100 parts by weight of the total amount of the (A) component and the (B) component, and preferably 30 to 60 parts by weight. When the amount is less than 20 parts by weight, the sensitivity becomes insufficient. When it exceeds 60 parts by weight, the photocured product becomes fragile.

The amount of the above-mentioned (C1) component is preferably 1 to 10 parts by weight with respect to 100 parts by weight of the total amount of the (A) component and the (B) component, more preferably 3 to 6 parts by weight. When the amount is less than 1 part by weight, the sensitivity tends to be insufficient. When it exceeds 10 parts by weight, the resolution is lowered.

The amount of the above-mentioned (C2) composition is preferably 0.01 to 3 parts by weight with respect to 100 parts by weight of the total amount of the (A) component and the (B) component, more preferably 0.1 to 1 part by weight. When the amount is less than 0.01 part by weight, the sensitivity becomes insufficient. When it exceeds 3 parts by weight, the resolution is lowered.

The amount of the above-mentioned (C3) composition is preferably 0.01 to 5 parts by weight with respect to 100 parts by weight of the total amount of the (A) component and the (B) component, more preferably 0.1 to 1 part by weight. When the amount is less than 0.01 part by weight, the sensitivity and the resolution tend to be lowered. When it exceeds 5 parts by weight, the resolution is lowered.

The amount of the above-mentioned (C4) composition is preferably 0.01 to 5 parts by weight with respect to 100 parts by weight of the total amount of the (A) component and the (B) component, more preferably 0.1 to 1 part by weight. When the amount is less than 0.01 part by weight, the sensitivity and the resolution is lowered. When it exceeds 5 parts by weight, the resolution tends to be lowered.

The amount of the above-mentioned (C5) composition is preferably 0.01 to 5 parts by weight with respect to 100 parts by weight of the total amount of the (A) component and the (B) component, more preferably 0.1 to 1 part by weight. When the amount is less than 0.01 part by weight, the sensitivity and the resolution tend to be lowered. When it exceeds 5 parts by weight, the resolution tends to be lowered.

By having the amounts of the (C2) component and the (C3) component in about the same part by weight, a further preferable effect can be obtained.

In the above-mentioned photosensitive resin composition, as needs arise, a photopolymerizable compound having at least one cyclic ether group to be cationically polymerized in a molecule, a cationic polymerization initiator, a dye such as a malachite green, a photo-coloring agent such as a leuko crystal violet, a thermal coloration preventing agent, a plasticizer such as p-toluene sulfon amide, a pigment, a filler, a defoamer, a flame retarder, a stabilizer, an adhesive promoter, a leveler, an antioxidant, a flavor, an imaging agent, a thermal cross-linking agent and the like can be included each by about 0.01 to 20 parts by weight with respect to 100 parts by weight of the total amount of the (A) component and the (B) component. These can be used alone or in combination of two or more kinds.

The above-mentioned photosensitive resin composition can be coated in a form of a solution of about a 30 to 60% by weight solid component, by dissolving the same in a solvent such as methanol, ethanol, acetone, methyl ethyl ketone, methyl cellosolve, ethyl cellosolve, toluene, N,N-dimethyl formamide, propylene glycol monomethyl ether and the like, or a solvent mixture thereof, as needs arises.

The above-mentioned photosensitive resin composition is not particularly limited, but it is preferable to be used by coating the same as a liquid resist on the surface of a metal such as copper, a copper based alloy, iron, an iron based alloy and the like, drying, and coveting the above with a protection film as needed, or to be used in a form of a photosensitive element.

Moreover, the thickness of the photosensitive resin composition layer differs depending on the use thereof, but it is preferably about 1 to 100 μm as the thickness after drying. In a case the liquid resist is used in a state covered with the protection film, a polymer film of a polyethylene, polypropylene and the like can be presented as the protection film.

The above-mentioned photosensitive element can be obtained by for example, coating and drying the photosensitive resin composition on a polymer film of polyethylene terephthalate, polypropylene, polyethylene, polyester and the like as a supporting member.

The above-mentioned coating operation can be carried out by a known method such as a roll coater, a comma coater, a gravure coater, an air knife coater, a die coater and a bar coater. Furthermore, the drying operation can be carried out at 70 to 150° C. for about 5 to 30 minutes. Moreover, the residual organic solvent amount in the photosensitive resin composition layer is preferably 2% by weight or less in terms of preventing the diffusion of the organic solvent in the subsequent steps.

The thickness of these polymer films is preferably 1 to 100 μm. These polymer films may be laminated on the both sides of the photosensitive resin composition layer with one of them as a supporting member for the photosensitive resin composition layer and the other one as the protection film for the photosensitive resin composition. As the protection film, one having a smaller bonding force between the photosensitive resin composition layer and the protection film with respect to the bonding force between the photosensitive resin composition layer and the supporting member is preferable. Moreover, a low fish eye film is preferable.

Furthermore, the above-mentioned photosensitive element may have an intermediate layer or a protection layer such as a cushion layer, a bonding layer, a light absorbing layer, and a gas barrier layer in addition to the photosensitive resin composition layer, the supporting member and the protection film.

The above-mentioned photosensitive element is stored for example as it is or in a state wound on a cylindrical winding core with a protection film further laminated on the other side of the photosensitive resin composition layer. It is preferable to roll it up so that the supporting member is disposed on the outermost side. It is preferable to install an end face separator on the end face of the above-mentioned rolled-state photosensitive element roll from the viewpoint of the end face protection, and it is preferable to install a moisture proof separator from the viewpoint of preventing the edge fusion. Moreover, as a packing method, it is preferable to package the same by wrapping it in a light-shielding sheet with a small moisture permeating property.

As the above-mentioned winding core, for example, a plastic such as a polyethylene resin, a polypropylene resin, a polystyrene resin, a polyvinyl chloride resin and an ABS resin (acrylonitrile-butadiene-styrene copolymer) can be presented.

In production of the resist pattern using the above-mentioned photosensitive element, in a case the above-mentioned protection film exists, there can be mentioned a method of laminating the photosensitive resin composition layer by pressing it with a pressure of about 0.1 to 1 MPa (about 1 to 10 kgf/cm$^2$) onto a circuit forming substrate while heating the same to about 70 to 130° C. after eliminating the protection film, and it is preferable to laminate the same under a reduced pressure. The surface to be laminated is generally a metal surface, but it is not particularly limited.

To the photosensitive resin composition layer with the lamination accordingly completed, an active light ray is irradiated as an image through a negative or positive mask pattern. As a light source of the above-mentioned active light ray, a known light source capable of effectively radiating an ultraviolet ray, a visible light and the like, such as a carbon arc lamp, a mercury vapor arc lamp, a high pressure mercury lamp, and an xenon lamp can be used. Moreover, the photosensitive resin composition of the present invention is effective for laser scanning exposure, and it is used particularly preferably for UV (ultraviolet ray) laser scanning exposure.

The above-mentioned UV laser is preferably an argon laser of a 300 to 400 nm dominant wavelength, more preferably an argon laser of 330 to 385 nm, particularly preferably an argon laser of 340 to 375 nm, and extremely preferably an argon laser of 350 to 365 nm. The output is not particularly limited, but it is preferably about 0.01 to 5 W. As the laser exposure device, for example, a product name DP-100 manufactured by Olbotech Corp. and the like can be presented.

Subsequently after the exposure, after eliminating the supporting member in case that the supporting member exists on the photosensitive resin composition layer, the unexposed part is removed by wet development by a developing solution such as an alkaline aqueous solution, a water based developer, an organic solvent and the like, or by dry development, so that the resist pattern can be produced.

As the above-mentioned alkaline aqueous solution, for example, a 0.1 to 5% by weight diluted solution of a sodium carbonate, a 0.1 to 5% by weight diluted solution of a potassium carbonate, a 0.1 to 5% by weight diluted solution of a sodium hydroxide, and the like can be presented. The pH of the above-mentioned alkaline aqueous solution is preferably in a range of 9 to 11, and the temperature thereof is adjusted according to the developing property of the photosensitive resin composition layer. Moreover, in the alkaline aqueous solution, a surfactant, a defoamer, an organic solvent, and the like may be included. As the above-mentioned developing method, for example, a dipping method, a spray method, brushing, slapping, and the like can be presented.

A 41-step step tablet to be used in the present invention having a density range from 0.00 to 2.00, a density step of 0.05, a tablet size of 20 mm×187 mm, and a step size of 3 mm×12 mm is available as a product name Hitachi 41-step step tablet manufactured by Fuji film Corp.

Moreover, in the present invention, "the photosensitive resin composition is cured at the 21st step (density 1.00) of a 41-step step tablet (a density range from 0.00 to 2.00, a density step of 0.05, a tablet size of 20 mm×187 mm, and each step size of 3 mm×12 mm)" means:

(1) when a time required for removing the photosensitive resin composition layer is defined as the minimum developing time, where a 1% by weight aqueous solution of a sodium carbonate is sprayed with a pressure of 0.15 MPa on the entire surface of the photosensitive resin composition layer laminated on a copper-clad laminated board, (2) the residual area (with respect to the step size of 3 mm×12 mm) on the substrate of the resist corresponding to the $21^{st}$ step (density of 1.00) is 90% or more, after irradiating an active light ray (high pressure mercury lamp full wavelength) by $E_1$ (mJ/cm$^2$) onto a photosensitive resin composition layer laminated on another copper-clad laminated board through a 41-step step tablet (a density range from 0.00 to 2.00, a density step of 0.05, a tablet size of 20 mm×187 mm, and each step size of 3 mm×12 mm), and spraying a 1% by weight aqueous solution of a sodium carbonate with a pressure of 0.15 MPa onto the entire surface of the layer (for a period two times as long as the minimum developing time).

As the process succeeding the development, as needs arises, the resist pattern may be further cured by heating at about 60 to 250° C. or by carrying out an exposure of about 0.2 to 10 mJ/cm$^2$ before use.

For etching of the metal surface after the development, for example, a cupric chloride solution, a ferric chloride solution, an alkaline etching solution and the like can be used.

In case of producing a printed wiring board using a photosensitive element of the present invention, the surface of the circuit forming substrate is processed by a known method such as etching and plating with the developed resist pattern used as a mask. As the above-mentioned plating method, for example, copper plating, solder plating, nickel plating, gold plating and the like can be presented.

Subsequently, the resist pattern can be removed, for example, with a stronger alkaline aqueous solution with respect to the alkaline aqueous solution used for the development. As the above-mentioned strong alkaline aqueous solution, for example, a 1 to 10% by weight sodium hydroxide aqueous solution, a 1 to 10% by weight potassium aqueous solution and the like can be used. As the above-mentioned removing method, for example, a dipping method, a spray method, and the like can be presented. Moreover, the printed wiring board with the resist pattern formed may be a multi-layered printed wiring board, and it may have through holes with a small diameter.

EXAMPLES

Hereinafter, the present invention will be explained with reference to the examples.

Examples 1 to 8 and Comparative Examples 1 to 3

A solution was obtained by mixing the (A) component, the (B) component and the other components as shown in table 1.

TABLE 1

| | | Amount to be blended |
|---|---|---|
| (A) component | A solution of a copolymer comprising methacrylic acid, ethyl methacrylate and styrene in a weight ratio of 29:46:25, with a weight average molecular weight of 45,000 and an acid value of 75 mg KOH/g, dissolved in methyl cellosolve/toluene (6/4 in a weight ratio) to make a solid portion 45% by weight | 111 g (50 g for solid portion) |
| (B) component | BPE 500 (2,2-bis(4-methacryloxypentaethoxy)phenyl)propane, manufactured by Shinnakamura Kagaku Kogyo, Co., trade name) | 30 g |
| | APG-400 (heptapropylene diacrylate, manufactured by Shinnakamura Kagaku Kogyo, Co., trade name) | 10 g |
| | NP - 8EA (nonylphenoxyoctaethyleneoxy acrylate, manufactured by Kyoeisha Kagaku, Co., trade name) | 10 g |
| Photo-coloring agent | Leuko crystal violet | 0.4 g |
| Pigment | Malachite green | 0.04 g |
| Solvent | Acetone | 10 g |
| | Toluene | 7 g |
| | N,N-dimethylformamide | 3 g |
| | Methanol | 3 g |

Subsequently, in the obtained solution, the (C) components shown in tables 2, 3 and 4 were dissolved to obtain solutions of the photosensitive resin composition.

TABLE 2

| | | Example 1 | Example 2 | Example 3 | Example 4 |
|---|---|---|---|---|---|
| (C 1) | 2,2'-bis(2-chlorophenyl)-4,4',5,5'-tetraphenylbisimidazole | — | 6.0 g | 6.0 g | — |
| | 3-MeO-2,6F-HABI*1 | 3.2 g | — | — | 3.2 g |
| (C 2) | N-phenylglycine | 0.2 g | 0.2 g | 0.2 g | 0.2 g |
| (C 3) | BBI105*2 | 0.2 g | 0.2 g | 0.2 g | 0.2 g |
| | Tetrabutylammonium benzyltriphenylborate | — | — | — | — |
| (C 4) | Tribromomethylphenylsulfone | 0.5 g | 0.5 g | — | — |
| (C 5) | Diethylaminobenzophenone | 0.15 g | — | 0.2 g | 0.2 g |
| | 7-diethylamino-4-methyl coumarin | — | — | — | — |
| Other | 2-mercaptobenzoxazole | — | — | — | — |

TABLE 3

| | | Example 5 | Example 6 | Example 7 | Example 8 |
|---|---|---|---|---|---|
| (C 1) | 2,2'-bis(2-chlorophenyl)-4,4',5,5'-tetraphenylbisimidazole | — | 3.0 g | 3.0 g | 3.0 g |
| | 3-MeO-2,6F-HABI*1 | 6.0 g | — | — | — |
| (C 2) | N-phenylglycine | 0.2 g | 0.2 g | 0.2 g | 0.2 g |
| (C 3) | BBI105*2 | 0.2 g | 0.2 g | 0.2 g | 0.2 g |
| | Tetrabutylammonium benzyltriphenylborate | — | 0.2 g | — | 0.2 g |
| (C 4) | Tribromomethylphenylsulfone | 0.5 g | 0.5 g | 0.5 g | 0.5 g |
| (C 5) | Diethylaminobenzophenone | — | 0.2 g | — | — |
| | 7-diethylamino-4-methyl coumarin | — | — | 0.2 g | 0.2 g |
| Other | 2-mercaptobenzoxazole | — | — | — | — |

TABLE 4

| | | Comp. Example 1 | Comp. Example 1 | Comp. Example 1 |
|---|---|---|---|---|
| (C 1) | 2,2'-bis(2-chlorophenyl)-4,4',5,5'-tetraphenylbisimidazole | 3.2 g | 3.2 g | 3.0 g |
| | 3-MeO-2,6F-HABI*1 | — | — | — |
| (C 2) | N-phenylglycine | — | — | — |
| (C 3) | BBI105*2 | — | — | 0.2 g |
| | Tetrabutylammonium benzyltriphenylborate | — | — | — |
| (C 4) | Tribromomethylphenylsulfone | — | — | — |
| (C 5) | Diethylaminobenzophenone | 0.15 g | 0.15 g | 0.15 g |
| | 7-diethylamino-4-methyl coumarin | — | — | — |
| Other | 2-mercaptobenzoxazole | — | 0.2 g | 0.2 g |

The materials used in the tables 2, 3 and 4 are shown below.

1: 3-MeO-2,6F-HABI (2,2'-bis(2,6-fluorophenyl)-4,4',5,5'-tetrakis(3-methoxyphenyl)bisimidazol, manufactured by Kurogane Kasei Kogyo Co., sample name)

2: BBI105 (4,4'-bis(tert-butyl)phenyl iodonium triflate, manufactured by Midori Kagaku Co., trade name)

Subsequently, photosensitive elements were obtained by evenly coating the solutions of the photosensitive resin compositions onto a 16 μm thickness polyethylene terephthalate film, and drying with a 100° C. hot air convection type drier for 10 minutes. The film thickness of the photosensitive resin composition layers were 20 μm.

Meanwhile, the copper surface of copper-clad laminated boards (produced by Hitachi Chemical Co. Ltd., trade name: MCL-E-61), which is a glass epoxy material with copper foils (thickness: 35 μm) laminated on the both surfaces was polished using a polisher (manufactured by Sankei Co.) having a brush corresponding to #600, washed with water and dried with an air flow. The obtained copper-clad laminated boards were heated to 80° C. Onto the copper surface, the above-mentioned photosensitive resin composition layers were laminated while heating at 110° C.

Next, using an exposing machine (manufactured by Oak Co.) 590 equipped with a high pressure mercury lamp, exposure was carried out at 5, 10 or 20 mJ/cm$^2$ with a Stoffer 41-step step tabled placed on a test piece as a negative film. Subsequently, the unexposed part was removed by peeling off a polyethylene terephthalate film and by spraying a 1% by weight sodium carbonate aqueous solution for 20 seconds (the minimum developing time: 10 seconds) at 30° C. Furthermore, the number of steps of the step tablet of the photocured film formed on the copper-clad laminated board was measured so that the exposure amount $E_0$ corresponding to the $21^{st}$ step was determined from the obtained number of steps by the exposure amount logarithmic regression calculation.

Next, the pattern after the development with an exposure amount corresponding to the step $21^{st}$ was observed with an optical microscope so that the resolution (μm) was determined from the line width (μm) remaining as a line and space.

The results are shown in table 5.

TABLE 5

| | Exposure amount $E_0$ (mJ/cm$^2$) | Resolution (μm) |
|---|---|---|
| Example 1 | 7 | 25 |
| Example 2 | 9 | 22 |
| Example 3 | 7 | 25 |
| Example 4 | 10 | 22 |
| Example 5 | 10 | 25 |
| Example 6 | 6 | 22 |
| Example 7 | 5 | 22 |
| Example 8 | 4 | 22 |
| Comparative Example 1 | 57 | 22 |
| Comparative Example 2 | 19 | 27 |
| Comparative Example 3 | 13 | 27 |

Subseqeuntly, the photosensitive elements used in Examples 3 to 5 and Comparative Examples 1 to 3 were laminated on the copper-clad laminated boards in the same manner. Using a direct imaging system (manufactured by Olbotech Co., trade name: DP-100M), with a Stoffer 41-step step table placed as a negative film on the test piece, laser scanning exposure was carried out at 5, 10 or 20 mJ/cm$^2$ (Dominant wavelength: 351 to 364 nm, output: 0.27 to 4.0W). Thereafter, the unexposed part was removed by removing the polyethylene terephthalate film and by spraying a 1% by weight sodium carbonate aqueous solution at 30° C. for 20 seconds.

Furthermore, the number of steps of the step tablet of the photocured film formed on the copper-clad laminated board was measured so that the exposure amount $E_0$ corresponding to the $21^{st}$ step was determined from the obtained number of steps by the exposure amount logarithmic regression calculation.

Next, the pattern after the development with an exposure amount corresponding to the step $21^{st}$ was observed with an optical microscope so that the resolution (μm) was determined from the line width (μm) remaining as a line and space. These results are shown in table 6.

TABLE 6

| | Exposure amount $E_0$ (mJ/cm$^2$) | Resolution (μm) |
|---|---|---|
| Example 3 | 8 | 30 |
| Example 4 | 10 | 30 |
| Example 5 | 10 | 30 |
| Comparative Example 1 | 60 | 40 |
| Comparative Example 2 | 20 | 45 |
| Comparative Example 3 | 14 | 45 |

As a result, it was revealed that the photosensitive elements used Examples 3 to 5 can be cured by a UV laser of a smaller exposure amount and have a better resolution, as compared to the photosensitive elements used in Comparative Examples 1 to 3.

Comparative Example 4

A solution was obtained by mixing the (A) component, the (B) component, the pigment and the solvent in the amounts shown in the above table 1, and to the obtained solution were added 3.3 g of a 2,2'-bis(2-chlorophenyl)-4,4'-5,5'-tetraphenylbisimidazol, a 9-phenylacrydine, 0.04 g of a diethylaminobenzophenone, 0.11 g of an N-phenylglycine and 1.6 g of a leuko crystal violet.

Next, a photosensitive element was obtained by evenly coating the solution of the photosensitive resin composition onto a 16 μm thickness polyethylene terephthalate film, and drying with a 100° C. hot air convection type drier for 10 minutes. The film thickness of the photosensitive resin composition layer was 20 μm.

Meanwhile, the copper surface of a copper-clad laminated board (manufactured by Hitachi Chemical Co. Ltd., trade name: MCL-E-61), which is a glass epoxy material with copper foils (thickness: 35 μm) laminated on the both surfaces was polished using a polisher (produced by Sankei Corp.) having a brush corresponding to #600, washed with water and dried with an air flow. The obtained copper-clad laminated board was heated to 80° C. Onto the copper surface, the above-mentioned photosensitive resin composition layer was laminated while heating at 110° C.

Next, using an exposing machine (manufactured by Oak Co.) 590 equipped with a high pressure mercury lamp, exposure was carried out at 5, 10, 20 mJ/cm$^2$ with a Stoffer 41-step step tabled placed on a test piece as a negative film. Next, the unexposed part was removed by peeling off the polyethylene terephthalate film and by spraying a 1% by weight sodium carbonate aqueous solution for 20 seconds at 30° C. Furthermore, the number of steps of the step tablet of the photocured film formed on the copper-clad laminated board was measured so that the exposure amount $E_0$ corresponding to the $21^{st}$ step was determined from the obtained number of steps by the exposure amount logarithmic regression calculation.

Next, the pattern after the development with an exposure amount corresponding to the step $21^{st}$ was observed with an optical microscope so that the resolution (μm) was determined from the line width (μm) remaining as a line and space.

The exposure amount $E_0$ of Comparative Example 4 was 23 mJ/cm², and the resolution was 30 μm.

Next, the photosensitive elements obtained in Examples 1 to 8 and Comparative Example 4 were left under a non-ultraviolet white lamp (manufactured by Hitachi Ltd., Hitachi discoloration preventing lamp, the light in a region of 400 nm or less being eliminated, 40 W) at a 1.5 m distance for 2 hours.

Meanwhile, the copper surface of copper-clad laminated boards (manufactured by Hitachi Chemical Co. Ltd., trade name: MCL-E-61), which is a glass epoxy material with copper foils (thickness: 35 μm) laminated on the both surfaces was polished using a polisher (produced by Sankei Corp.) having a brush corresponding to #600, washed with water and dried with an air flow. The obtained copper-clad laminated boards were heated to 80° C. Onto the copper surface, the photosensitive resin composition layers of the photosensitive elements after being left were laminated while heating at 110° C.

Next, using an exposing machine (manufactured by Oak Co.) 590 equipped with a high pressure mercury lamp, exposure was carried out at 5, 10 or 20 mJ/cm² with a Stoffer 41-step step tabled placed on a test piece as a negative film. Next, the unexposed part was removed by peeling off the polyethylene terephthalate film and by spraying a 1% by weight sodium-carbonate aqueous solution for 20 seconds at 30° C. Furthermore, the number of steps of the step tablet of the photocured film formed on the copper-clad laminated board was measured so that the exposure amount $E_1$ corresponding to the $21^{st}$ step was determined from the obtained number of steps by the exposure amount logarithmic regression calculation.

Next, the pattern after the development with an exposure amount corresponding to the step $21^{st}$ was observed with an optical microscope so that the resolution (μm) was determined from the line width (μm) remaining as a line and space. These results are shown in table 7.

TABLE 7

| | Exposure Amount $E_0$ (mJ/cm²) | Exposure Amount $E_0$ (mJ/cm²) | Resolution before left for 2 hours (μm) | Resolution after left for 2 hours (μm) | $\{(E_1 - E_0)/E_0\} \times 100$ |
|---|---|---|---|---|---|
| Example 1 | 7 | 8 | 25 | 25 | 14 |
| Example 2 | 9 | 11 | 22 | 22 | 22 |
| Example 3 | 7 | 8 | 22 | 22 | 14 |
| Example 4 | 10 | 12 | 25 | 25 | 20 |
| Example 5 | 10 | 12 | 22 | 22 | 20 |
| Example 6 | 6 | 7 | 25 | 25 | 17 |
| Example 7 | 5 | 6 | 22 | 22 | 20 |
| Example 8 | 4 | 5 | 22 | 22 | 25 |
| Comp. Example 4 | 23 | 34 | 30 | 42 | 48 |

Discoloration amounts of the photosensitive elements obtained in Examples 1 to 8 and Comparative Example 4 were measured after being left for 2 hours under a non-ultraviolet white lamp. It was found that Examples 1 to 8 of the present invention have less discoloration after being left for 2 hours, as compared to Comparative Example 4, therefore having an excellent processability.

INDUSTRIAL APPLICABILITY

The photosensitive resin composition for laser scanning exposure of the present invention has little fluctuation of the exposure amount $E_0$ and the exposure amount $E_1$ after a long term storage so that it has an excellent long term storage property and processability, and furthermore, it is excellent in resolution after a long term storage, a laser imaging compatibility, particularly an ultraviolet ray laser imaging compatibility and discoloration stability.

The photosensitive resin composition of the present invention has an excellent sensitivity, resolution, developing property and mechanical strength, and thus, it is effective for achieving a high density in a printed wiring board and for laser exposure, particularly an ultraviolet ray laser exposure.

Moreover, the photosensitive element of the present invention has an excellent sensitivity, resolution, developing property, mechanical strength, productivity and processability so that it is effective for achieving a high density in a printed wiring board and for laser exposure, particularly an ultraviolet ray laser exposure.

Furthermore, the method for producing a resist pattern of the present invention has an excellent sensitivity, resolution, developing property, mechanical strength, productivity and processability so that it is effective for achieving a high density in a printed wiring board and for laser exposure, particularly an ultraviolet ray laser exposure.

Furthermore, the method for producing a printed wiring board of the present invention has an excellent sensitivity, resolution, developing property, mechanical strength, productivity and processability so that it is effective for achieving a high density in a printed wiring board and for laser exposure, particularly an ultraviolet ray laser exposure.

Furthermore, the method for producing a resist pattern of the present invention has an excellent sensitivity, resolution, productivity and processability so that it is effective for achieving a high density in a printed wiring board. It allows an operation under a yellow lamp so that the operation can be carried out in a conventional clean room.

The invention claimed is:

1. A photosensitive resin composition comprising:
  (A) a binder polymer containing both of a (meth)acrylic acid and an alkyl ester of the (meth)acrylic acid as constitutional monomers;
  (B) a photopolymerizable compound having at least one polymerizable ethylenically unsaturated group in a molecule; and
  (C) a photopolymerization initiator, wherein said component (C) comprises as essential components:
    (C1) a hexaaryl bisimidazol compound;
    (C2) an aryl glycine based compound; and
    (C3) an onium salt compound, wherein the resin composition includes 0.01 to 3 parts by weight of component (C2), based on 100 parts by weight of component (A) and component (B).

2. The photosensitive resin composition according to claim 1, wherein an aryl group of the (C1) hexaaryl bisimidazol compound has an alkoxy group having 1 to 6 carbon atoms.

3. The photosensitive resin composition according to claim 2, wherein the number of the alkoxy group having 1 to 6 carbon atoms in a molecule of the (C1) hexaaryl bisimidazol compound is four.

4. The photosensitive resin composition according to claim 3, wherein the (C1) component is a compound represented by the general formula (I):

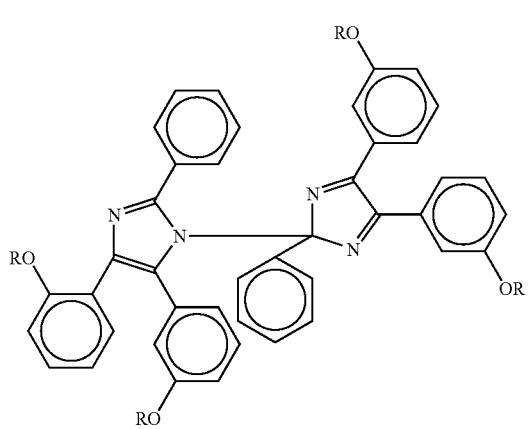

(I)

wherein four Rs each independently represent an alkyl group having 1 to 6 carbon atoms.

5. The photosensitive resin composition according to claim 4, wherein the (C2) component is a compound represented by the general formula (II):

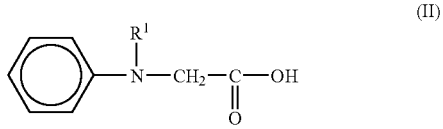

(II)

wherein $R^1$ represents a hydrogen atom or an alkyl group having 1 to 6 carbon atoms.

6. The photosensitive resin composition according to claim 5, wherein the (C3) onium salt compound is an ammonium salt compound, an iodonium salt compound or a sulfonium salt compound.

7. The photosensitive resin composition according to claim 6, wherein the (C3) onium salt compound is an onium boron salt compound.

8. The photosensitive resin composition according to claim 7, further comprising (C4) an organic halogen based compound.

9. The photosensitive resin composition according to claim 8, further comprising (C5) a benzophenone compound having an alkyl amino group or a coumarin compound.

10. The photosensitive resin composition according to claim 9, wherein the (B) component comprises a bisphenol A based (meth) acrylate compound as an essential component.

11. The photosensitive resin composition according to claim 10, wherein the (A) binder polymer comprises a styrene or a styrene derivative as an essential copolymerization component.

12. The photosensitive resin composition according to claim 11, wherein the composition ratios of each of the (A) component, the (B) component and the (C) component is 40 to 80 parts by weight for the (A) component, 20 to 60 parts by weight for the (B) component and 0.01 to 20 parts by weight for the (C) component based on 100 parts by weight of the total weight of the (A) component and the (B) component, and the composition ratios of each of the (C1) component, the (C2) component and the (C3) component is 1 to 10 parts by weight for the (C1) component, 0.01 to 3 parts by weight for the (C2) component and 0.01 to 5 parts by weight for the (C3) component based on 100 parts by weight of the total weight of the (A) component and the (B) component.

13. A photosensitive element obtained by coating the photosensitive resin composition according to claim 12 on a supporting member and drying the same.

14. A method for producing a resist pattern, comprising the steps of laminating the photosensitive element according to claim 13 on a substrate for forming a circuit in such a way that the photosensitive resin layer is closely contact with the substrate, irradiating an active light according to an image, photocuring an exposed portion and removing an unexposed portion by development.

15. A method for producing a printed wiring board, comprising etching or plating a substrate for forming a circuit, on which a resist pattern is produced by the method for producing a resist pattern according to claim 14.

16. A method for producing a resist pattern, comprising the steps of laminating a photosensitive resin layer, having a composition according to claim 1, on a substrate for forming a circuit in such a way that they are closely contacted, scanning an exposing the same with a UV (ultraviolet ray) laser, photocuring an exposed portion, and removing an unexposed portion by development.

17. A photo sensitive resin composition comprising: (A) a binder polymer;
(B) a photopolymerizable compound having at least one polymerizable ethylenically unsaturated group in a molecule; and
(C) a photopolymerization initiator, wherein the photopolymerization initiator comprises:
  i. a hexaaryl bisimidazol compound represented by the general formula (I):

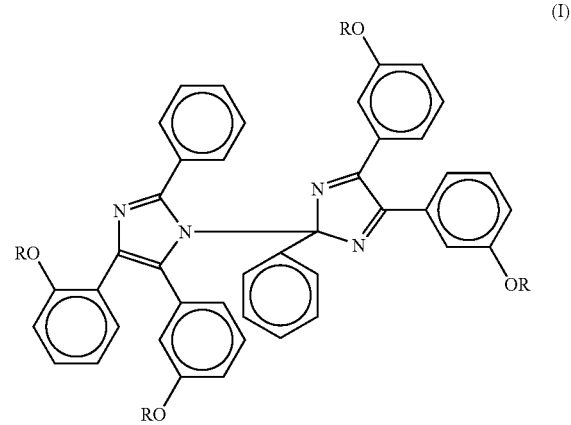

(I)

wherein the four Rs each independently represent an alkyl group having 1 to 6 carbon atoms;
  ii. an aryl glycine based compound represented by the general formula (II):

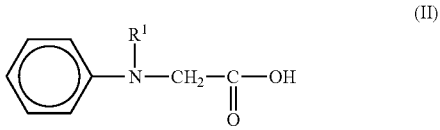

(II)

wherein $R^1$ represents a hydrogen atom or an alkyl group having 1 to 6 carbon atoms; and
  iii. an onium salt compound.

* * * * *